(12) United States Patent
Alberth, Jr. et al.

(10) Patent No.: US 8,902,010 B2
(45) Date of Patent: Dec. 2, 2014

(54) MICROELECTRONIC MACHINE-BASED ARIABLE

(71) Applicant: Motorola Mobility LLC, Libertyville, IL (US)

(72) Inventors: William P. Alberth, Jr., Prairie Grove, IL (US); Gregory R. Black, Vernon Hills, IL (US); Richard E. Mach, Cary, IL (US)

(73) Assignee: Motorola Mobility LLC, Chicago, IL (US)

( * ) Notice: Subject to any disclaimer, the term of this patent is extended or adjusted under 35 U.S.C. 154(b) by 32 days.

(21) Appl. No.: 13/732,515

(22) Filed: Jan. 2, 2013

(65) Prior Publication Data
US 2014/0184347 A1    Jul. 3, 2014

(51) Int. Cl.
*H03B 5/30* (2006.01)
*H01L 41/053* (2006.01)
*H01L 41/09* (2006.01)
*H03H 9/46* (2006.01)
*H03H 9/24* (2006.01)
*H03H 9/02* (2006.01)
*H03H 9/15* (2006.01)
*H03H 7/00* (2006.01)
*H03H 9/19* (2006.01)

(52) U.S. Cl.
CPC ............... *H03B 5/30* (2013.01); *H03H 9/467* (2013.01); *H03H 2009/155* (2013.01); *H03H 9/2457* (2013.01); *H03H 9/02409* (2013.01); *H03H 2007/008* (2013.01); *H03H 9/02393* (2013.01); *H03H 2009/0233* (2013.01); *H03H 2009/02291* (2013.01); *H03H 9/19* (2013.01)
USPC .......... 331/154; 331/177 R; 310/312; 968/822

(58) Field of Classification Search
USPC ............ 84/484; 310/311, 312, 326–329, 368, 310/370; 324/76.49, 51; 331/154, 156, 331/177 R; 333/186, 188, 196, 200; 368/134; 968/818–824
See application file for complete search history.

(56) References Cited

U.S. PATENT DOCUMENTS

| | | | |
|---|---|---|---|
| 1,548,738 A * | 8/1925 | Pappas | ............................ 84/484 |
| 6,404,304 B1 | 6/2002 | Kwon et al. | |
| 7,068,126 B2 * | 6/2006 | Huang et al. | .................. 333/186 |
| 7,116,863 B2 | 10/2006 | Kim et al. | |

(Continued)

FOREIGN PATENT DOCUMENTS

| | | |
|---|---|---|
| EP | 0275338 A1 | 7/1988 |
| JP | 2007288321 A | 11/2007 |

OTHER PUBLICATIONS

Patent Cooperation Treaty, International Search Report and Written Opinion of the International Searching Authority for International Application No. PCT/US2013/077911, Apr. 2, 2014, 17 pages.

*Primary Examiner* — Levi Gannon
(74) *Attorney, Agent, or Firm* — Faegre Baker Daniels LLP (57) ABSTRACT

A tunable resonator is provided that has a high Q for each resonate frequency. The tunable resonator is a MEMs tunable resonator wherein the tuner is affected by moving a moveable mass, associated with the resonating portion of the resonator, form a first position to a second position such that the moveable mass is held in the first position or second position by a detent rather than a constant electromagnet magnetic or electrostatic force applied thereon.

15 Claims, 4 Drawing Sheets

(56) References Cited

U.S. PATENT DOCUMENTS

| | | |
|---|---|---|
| 7,245,057 B2 * | 7/2007 | Ma et al. .................. 310/312 |
| 7,312,553 B2 * | 12/2007 | Laermer .................. 310/312 |
| 7,355,714 B2 | 4/2008 | Wang et al. |
| 7,456,711 B1 | 11/2008 | Goldsmith |
| 7,514,759 B1 | 4/2009 | Mehta et al. |
| 7,592,739 B2 | 9/2009 | Robert |
| 7,696,673 B1 * | 4/2010 | Yavid ....................... 310/339 |
| 7,728,701 B2 | 6/2010 | Lin et al. |
| 7,804,382 B2 | 9/2010 | Shin |
| 7,892,759 B2 * | 2/2011 | Mutharasan et al. ......... 435/7.1 |
| 8,717,111 B2 * | 5/2014 | Phan Le et al. ............. 331/154 |
| 2005/0162040 A1 | 7/2005 | Robert |
| 2007/0096850 A1 | 5/2007 | Huang |
| 2009/0115553 A1 | 5/2009 | Shin et al. |
| 2009/0246929 A1 | 10/2009 | Margomenos et al. |
| 2009/0309676 A1 | 12/2009 | Zettl et al. |
| 2010/0060386 A1 | 3/2010 | Belot |
| 2010/0271003 A1 | 10/2010 | Jensen |
| 2011/0128083 A1 | 6/2011 | Pomarico |
| 2011/0148537 A1 * | 6/2011 | Watanabe et al. ............. 331/154 |
| 2013/0127295 A1 * | 5/2013 | Jun et al. .................... 310/327 |

* cited by examiner

MICROELECTRONIC MACHINE-BASED
ARIABLE

TECHNICAL FIELD

The present invention relates generally to resonator circuitry. More particularly, the invention relates to a microelectronic machine (MEM) based variable resonator adapted for incorporation into an integrated circuit.

BACKGROUND

Crystals have been used as resonators in resonation or oscillation circuitry for about as long as radio devices have been around. So the well-known drawbacks of using crystals in oscillator and/or filtering circuits are that they are relatively expensive with respect to the manufacturing costs of mass-produced integrated circuits. Furthermore, crystals cannot be directly mounted to an integrated circuit. Crystals must be sealed in a special container that is separate from an integrated circuit. These special containers are used to stop contamination of the crystal. Such contamination by dirt particles would vary the oscillation frequency of the crystal. In addition crystals have reliability problems wherein crystals oscillate at substantially different base frequencies depending on their surrounding temperature.

Research has led to a family of new devices that are possible viable replacements for the crystal oscillator of yesteryear. Such new devices are called microelectronic machines (MEMs). To date, single frequency MEMs are thought to be capable of providing the basis for a high Q oscillator that equals or exceeds the capability of crystal oscillators. A high Q factor for an oscillator describes how under damped and oscillator or resonator is, or equivalently, characterizes a resonator's bandwidth relative to its center frequency. The higher the Q, the lower the rate of energy loss relative to the stored energy of the resonator. For example, a single frequency MEM oscillator can be easily incorporated into a silicon device; thus, additional space for an external crystal is no longer required. Furthermore, single frequency MEMs have been designed to provide cost efficient reliability performance over temperature ranges that exceeds various crystal based oscillators and radio frequency (RF) filter circuitry.

BRIEF DESCRIPTION OF THE DRAWINGS

The accompanying figures, wherein like reference numerals refer to identical or functionally similar elements throughout the separate views and which together with the detailed description below are incorporated in and form part of the specification, so to further illustrate various embodiments and to explain various principals and advantages all in accordance with embodiments of the present invention.

DETAILED DESCRIPTION

Referring now to the drawings, wherein like reference numbers are used herein to designate like elements throughout, the various views and embodiments of microelectronic machine based variable resonators are illustrated and described, and other possible embodiments are described. The figures are not necessarily drawn to scale, and in some instances the drawings have been exaggerated and/or simplified in places for illustrative purposes only. The elements and items defined and described in the description such as those pertaining to the detailed construction and elements of the invention are provided to assist in a comprehensive understanding of the various embodiments of the invention and are merely exemplary. Accordingly, those of ordinary skill the art will recognize that various changes and modifications of the embodiments described here can be made without departing from the scope in spirit of the invention. Also descriptions of known functions and constructions of integrated circuit and MEM devices are omitted for clarity and conciseness.

In the wireless telecommunication arena, the specifications for Long Term Evolution (LTE) wireless telecommunication can result in a mobile communication device or User Equipment (UE) in utilizing over forty frequency bands. It is further understood that the number of frequency bands that will be used by a single UE will further increase. With the addition of frequency bands used by a UE transmitter and receiver circuit, there is a need for the creation of more available oscillation/clock frequencies within the UE's transceiver circuitry. If crystal based oscillator circuits are used, additional crystals that take up additional room in a UE will be required. Additionally, the additional crystal oscillator-based circuits will require additional oscillators oscillating at different frequencies along with complex frequency division circuitry connected to the additional oscillators in order to provide all of the necessary frequencies required by the receivers, transmitters and modulators in new LTE radio devices and/or other communication devices.

Furthermore, resonators are often put together to create RF filters, but since crystal oscillator based resonators are not adaptive or tunable to different frequencies, such RF filters will require additional space and manufacturing expense to place them within transceivers of mobile devices. Recently some research has created a new type of acoustic resonator referred to as a mechanical Film Bulk Acoustic Resonators (FBARs), which are a very simple type of MEM. These resonators may be integrated and provide high quality factors (Q factors), but only at a single oscillation frequency. In an FBAR resonator, a bulk acoustic wave is generated by excitation of a thin piezoelectrical bar that is between two electrodes. High Q FBAR resonators have been used to make filters within the 300 megahertz to 12.5 gigahertz range.

One problem with an FBAR resonator occurs when an FBAR Resonator is modified to become a tunable resonator. U.S. Pat. No. 7,804,382 to Shin et al., depicts a tunable resonator that incorporates a FBAR for preforming a resonance. A driver voltage is increased which deforms a portion of the FBAR construction such that a bar is snapped down to increase the mass of the FBAR thereby adjusting its residence frequency. In this device, the deformation of the FBAR must be held in place by a constant force so that the new resonant frequency does not switch back to the original resonant frequency. Once the additional driver or voltage is removed then the new resonant frequency can switch back to the old residence frequency. A drawback of this type of tunable FBAR acoustic resonator is that each time an additional FBAR mass is forced to press against the resonating part of the FBAR by an external signal/force, the Q of the resulting resonator decreases. What is needed is a MEM based resonator that can be adaptive to oscillate at different frequencies without decreasing the Q or quality of the MEM resonator at each of the different resulting frequencies. Furthermore what is needed is a tunable filter made from adaptive high quality MEM resonators that can be embedded in a single integrated circuit. Additionally what is needed is a high Q, tunable MEM resonator that can be incorporated into a silicon device such that integration of resonators and filters into a silicon device or resulting UE requires less space, is more cost effective and can provide the multitude of frequencies needed in modern communication equipment.

The embodiments of the present invention provide a MEM based resonator that can be adapted to oscillate at different frequencies without the necessity of a constant voltage or physical force placed on any portion of the MEM device to hold or position a portion of the MEM device to oscillate in a predetermined frequency.

Furthermore, other embodiments can be combined to provide a tunable filter made from adaptive high Q MEM resonators connected together and embedded in a single integrated circuit.

Additional embodiments provide a high Q, tunable MEM resonator or oscillator that can be incorporated into a silicon device such that integration of such resonators and filters into a transceiver or communication device requires less space, is more cost effective and can provide the multitude of frequencies needed in modern communication equipment.

In an embodiment of the invention a microelectronic machine (MEM) resonator is provided that has a resonation mass adapted to resonate. The resonation mass comprises a fixed portion and a movable portion. The MEM resonator further includes a resonation adjustment structure adapted to adjust the position of the movable portion. The resonation adjustment structure has a first mode of operation and a second mode of operation. When in the first mode of operation the resonation adjustment structure is adapted to adjust the position of the movable portion relative to the fixed portion. When in the second mode of operation the resonation adjustment structure is adapted to decouple or reduce the coupling of the resonation adjustment structure with the movable portion.

In some embodiments the resonation adjustment structure is substantially mechanical that applies a force by mechanical movement of the resonation adjustment structure. When the resonation adjustment structure is substantially mechanical, the resonation adjustment structure may comprise a first position and a second position. When in the first position, the position of the movable portion can be adjusted. Alternatively, while in the second position the there is reduced coupling between the resonation adjustment structure and the movable portion.

In other embodiments, the resonation adjustment structure may produce a significant electric field. When, during a first mode, the resonation adjustment structure is energized the resonation adjustment structure is adapted to move the movable portion from a first position to a second position to thereby change the resonant frequency of the resonation mass. Alternatively, when the resonation adjustment structure is not energized (or placed a lesser or unenergized mode) in the second mode, the resonation adjustment structure is substantially decoupled or uncoupled from the resonation mass.

In another embodiment a microelectronic machine (MEM) micro-resonator is provided. The MEM micro resonator comprises a pedestal portion with a resonator portion attached at a first end to the pedestal portion. Additionally, a resonation adjustment mass that is associated with the resonator portion is provided. The resonation adjustment mass is or can be mechanically isolated from structures other than the resonator portion. The resonation adjustment mass is also configured to be positionable into a plurality of settable locations wherein each of the settable locations results in a different resonant frequency for the MEM micro-resonator. Additionally there is a control electrode that is adapted to re-position the resonation adjustment mass from a first position to a second position, of the settable positions, when a predetermined charge is placed on the control electrode.

In some embodiments the resonation adjustment mass is connected to the resonator portion by a micro hinge with detents such that each detent of the micro hinge represents a different settable location.

In embodiments of the MEM micro-resonator the plurality of settable locations are located or positioned on a longitudinal axis of the resonator portion.

In some embodiments the resonator portion comprises a beam resonator. In yet additional embodiments, one of the plurality of several locations positions the resonation adjustment mass to be mechanically isolated from the resonator portion.

In yet other embodiments of the invention an integrated circuit is provided. The exemplary integrated circuit comprises a microelectronic machine, (MEM) resonator device. The MEM resonator device comprised within the integrated circuit includes a resonator structure and a control electrode. The resonator structure comprises a resonation portion and a moveable mass. The moveable mass is mechanically isolated from structures other than the resonator portion. Moveable mass is further configured to be positioned in one of a plurality of resonation positions. The control electrode is positioned substantially adjacent to the moveable mass. The control electrode is configured to produce an electrode-static force that moves the moveable mass from one of the plurality of resonation positions to another one of the plurality of resonation positions when an electrical charge is applied to the control electrode. When the electrical charge is removed from the control electrode the moveable mass remains at the resonation position that it was just moved to.

In various embodiments the moveable mass portion is connected to the resonator portion by a micro-hinge. In some embodiments the micro hinge may include a plurality of detented positions that coincide with the plurality or resonation positions.

In yet other embodiments, one of the plurality of resonation positions is positioned such that the moveable mass is mechanically isolated from the resonator portion.

Yet other embodiments of the invention, a method of adjusting a resonant frequency of a microelectronic machine (MEM) resonator device is provided. Here, the MEM resonator device comprises of resonator structure having a resonator portion and a moveable mass. The moveable mass is mechanically isolated from structures other than the resonator portion. The moveable mass is additionally configured to be positioned in one of a plurality of resonation positions. Also a control electrode is positioned adjacent or substantially adjacent to the moveable mass. The method of adjusting the resonate frequency of the MEM resonator device comprises applying a charge to the control electrode that creates an electrostatic force on the moveable mass. The moveable mass is then moved from a first resonation position to a second resonation position to thereby change the overall resonation frequency of the resonator structure from a first resonator frequency to a second resonation frequency. The charge is then removed from the control electrode, and the moveable mass remains in this second resonation position to thereby provide a high Q oscillation frequency when the resonator device is in operation.

In some embodiments the moveable mass may be held in the second resonation position by a detent.

Figure 1:
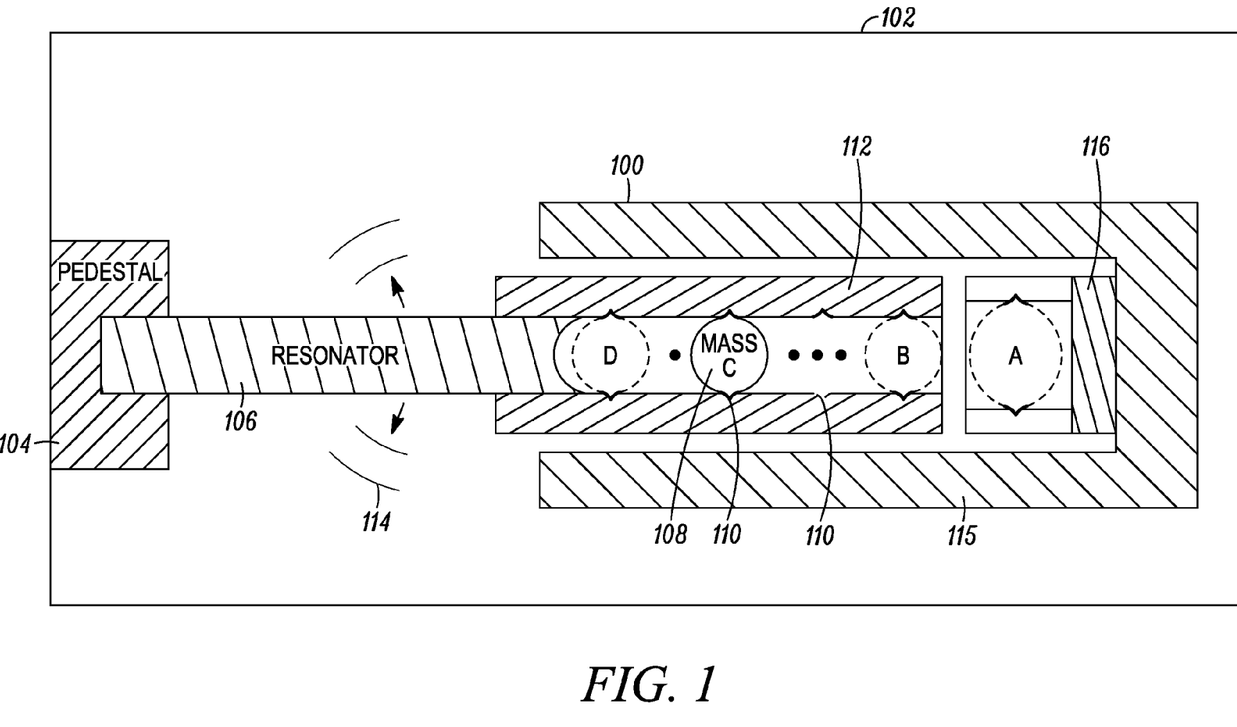
FIG. 1 is a view illustrating an exemplary tunable MEMs resonator in silicon.

Referring now to FIG. 1, a view of an integrated circuit 102 comprising an exemplary tunable MEMs resonator 100 in accordance to an embodiment of the present invention is shown. A pedestal 104 constructed of silicon, or metals or a combination thereof is provided to support a resonator 106. The resonator 106 may be a beam acoustic wave (BAW) resonator, a beam resonator, or an AT cut crystal or other similar or facsimile thereof type of resonator. The beam resonator 106 may be only a portion of the whole resonator. The beam resonator 106 is anchored at one end in the pedestal 104. At a second end of the beam resonator 106 has a mass placement structure 112, which is constructed to provide multiple positions, (B, C, D) with detents 110. The detents 110 are adapted to hold and or position a moveable mass 108. In this embodiment, the moveable mass 108 can be positioned in locations along a longitudinal axis of the beam resonator 106. The moveable mass 108, which may also be referred to as the resonation adjustment mass, may be mechanically isolated from all physical structures except for the resonator portion 106 (i.e., in positions B, C and D).

In some embodiments, the moveable mass 108 may be moveable into a position, such as position A, wherein the moveable mass 108 is mechanically isolated from the beam resonator 106 but is no longer mechanically isolated from the physical structures of the rest of the device. In position A, the moveable mass does not contribute mass to the resonator 106.

A control electrode 116 is positioned adjacent to the moveable mass 108 and a second end of the resonator portion 106. When a charge on the control electrode is substantially the same as the charge on the resonator portion 106, the moveable mass 108 will remain in its present detented position, such as position C shown. With the moveable mass 108 in position C within the mass placement structure 112, the combination of the resonator portion 106, the mass placement structure 112 and the moveable mass 108 in position C will have, for example, a first resonation or oscillation frequency when the resonator 106 is excited by appropriate circuitry well-known in the art, which would not include the control electrode 116 because the control electrode 116 is not used to excite the resonator into oscillation. The resulting oscillator with the moveable mass 108 in detent position C will provide a high Q oscillation output. The beam resonator 106 will vibrate as shown by the arrows noted by 114.

The exemplary tunable MEMs resonator 100 can be tuned to a second resonation frequency, for example, by applying a predetermined control charge or voltage to the control electrode 116 that creates a force on the moveable mass 108. The force is used to either push the moveable mass 108 toward the detents of position D or pull the moveable mass 108 toward the detents of position B. If the moveable mass 118 is moved into the detent position D the resulting resonant oscillation frequency of the resonator will increase to a second predetermined resonant oscillation frequency. Conversely, if the moveable mass 118 is moved to, for example, to detent position B within the mass placement structure 112, then the overall resonator will resonate at a lower predetermined resonant oscillation frequency. Additionally, when a control voltage is applied to the control electrode 116 to either push or pull the moveable mass 108 from a first resonation position to a second resonation position, then when the extra moveable mass 108 arrives at the notched detent position, (for example detent position B) then the control voltage on the control electrode can be removed, since the detents 110 hold the moveable mass 108 in its new position B. By not requiring a constant force created by a charge on the control electrode to keep the moveable mass 108 in position B (or any other position), the Q of the resulting resonator is not decreased or sacrificed. Thus, a high Q resonator results regardless of the position of the moveable mass during the resonation or vibration 114. In some embodiments, a detent position A, which is not mechanically part of the mass placement structure 112, allows the removable mass 108 to be moved into an isolated position A that is mechanically isolated from the resonator portion 106 and the mass placement structure 112. Placement of the moveable mass 108 in detent position A will allow the beam resonator 106 to vibrate 114 at its highest predetermined oscillation frequency without decreasing the Q of the overall oscillation device.

The exemplary tunable or adjustable MEMs resonator 100 can be manufactured into and as an integral part of an integrated circuit using known MEMs manufacturing techniques.

Figure 2:
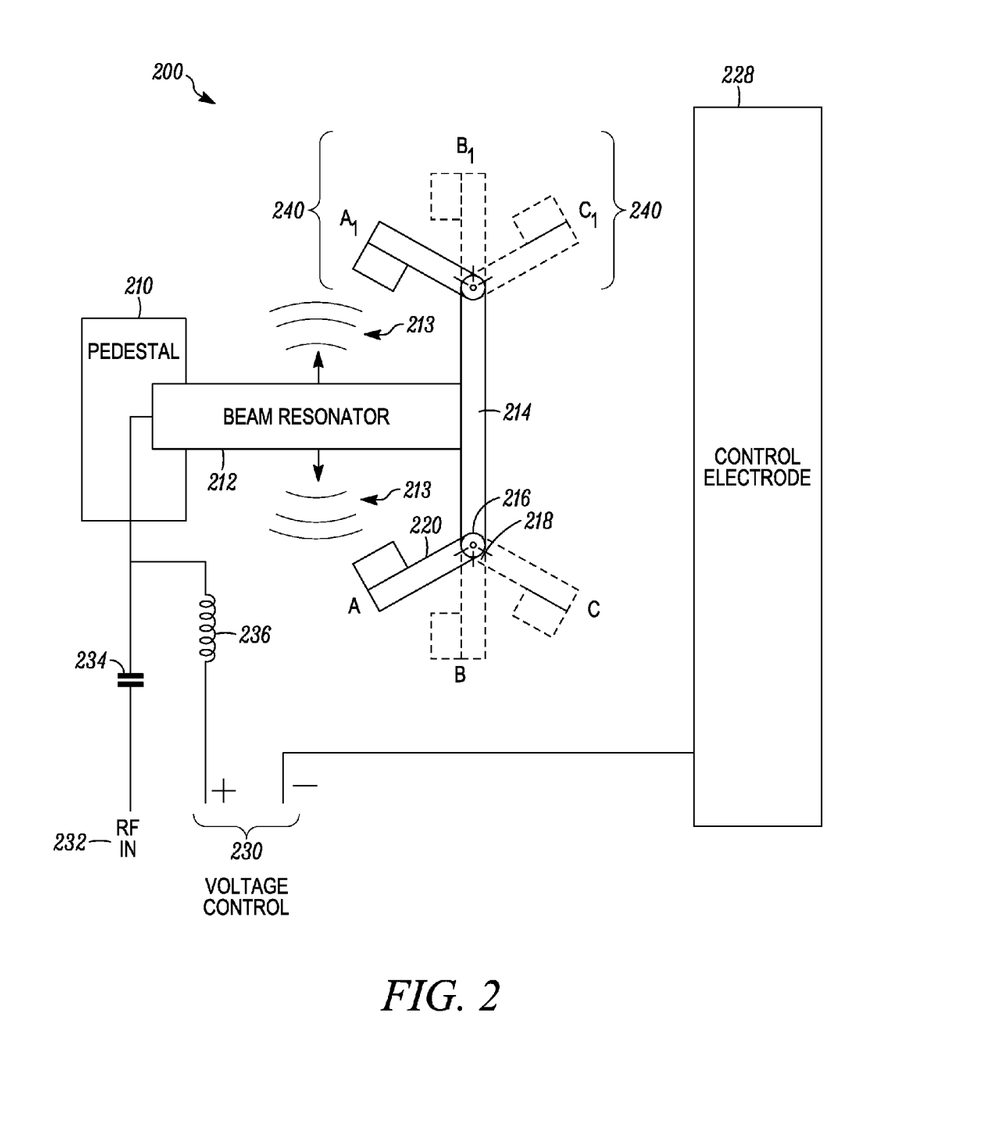
FIG. 2 is a view of the second exemplary MEMs resonator constructed in silicon.

Referring now to FIG. 2, a second embodiment of a tunable MEMs resonator or variable MEMs oscillator 200 is shown. It is understood that, like the MEMs resonator 100, this MEMs resonator 200 can be integrated into an integrated circuit using known MEMs manufacturing techniques. A pedestal 210 is connected to one end of a beam resonator 212. The beam resonator may be a BAW type resonator or an AT cut crystal or other similar derivation thereof. The beam resonator 212 when excited will vibrate or oscillate in accordance with arrows 213. At a second end or at a position on the beam resonator 212 distal from the pedestal, an adjustable mass portion 214 is mechanically attached or affixed to the beam resonator 212. The adjustable mass portion 214 has a first micro hinge 216. The micro hinge 216 may have two or more detent positions 218. Each detent position is adapted to hold or temporally hold a moveable mass 220 in a detent position such as position A, position B, or position C while the resonator oscillates.

A voltage control input 230 provides, for example, a voltage differential between the control electrode 228 and the beam resonator portion 212. By applying a voltage to the control electrode an electrostatic or electromagnetic force is created that moves the movable mass 220 from detent position A to, for example, detent position B via the micro hinge 216. After the moveable mass 220 is moved from position A to position B the control voltage 230 can be turned off and the electrostatic force removed, yet the detent position B will hold the moveable mass in place. When the moveable mass 220 is moved from detent position A to detent position B the resonant frequency of the whole resonator structure is changed from a first predetermined resonant frequency in detent position A to a second predetermined resonant frequency in detent position B.

Since no electrostatic or electromagnetic force is being used to hold the moveable mass 220 in one detent position over another detent position, the Q of the beam resonator 212 and adjustable mass portion 214 combination is not decreased or diminished. As such, a high Q can be obtained and maintained for each of the tunable oscillation frequency for the exemplary variable MEM oscillator 200.

In some embodiments more than one moveable mass portion may be attached or associated with the adjustable mass portion 214. For example, in the embodiment depicted, a second micro hinged moveable mass having detent positions A1, B1 and C1 is shown 240.

Additionally, an RF input 232 is provided, which electrically connects to the beam resonator via a high pass filter 234. A low pass filter 236 is part of the control voltage circuit 230 so that a DC charge can be applied or removed to help enable the control electrode 228 to establish an electrostatic force for moving the moveable mass 220 from a first detent position to a second detent position so as to change the resonant frequency of the exemplary tunable/variable MEMs oscillator 200. It is understood that similar or other known circuitry can be used to excite or oscillate the exemplary beam resonator in this embodiment or the embodiment of FIG. 1 as well.

By providing a tunable MEMs micro resonator in accordance to embodiments of the present invention, a multi frequency, settable, high Q oscillator can be incorporated into an integrated circuit. Furthermore by adjusting the center of mass or mass of an exemplary resonator, not only can a high Q tunable Q resonator result, but adjustable and programmable filters can also be created and incorporated into silicon using the exemplary tunable MEMs resonators. Such resulting MEMs tunable filters only require a fairly compact amount of space and can be mass produced at a reasonably low price.

It is also envisioned that a mechanical means could be fashioned to move the position of a movable mass. For example: the resonator may have a screw like structure embedded. The MEMs may include a screwdriver that can engage the screw and turn it to advance the mass into the resonator or withdraw it from the resonator. As the screw is moved, the mass of the screw is moving which will change the resonate frequency of the resonator. Once the screw is in a position that results in the desired resonate frequency, the screwdriver may be disengaged from the screw. The screwdriver when engaged will dampen the any resonation of the device resulting in a degradation of the Q or quality factor. By engaging the screw to adjust the position of the mass, and then disengaging, the MEMs resonator can provide a high Q tunable element.

It is further envisioned that multiple tunable resonators may be connected together to realize tunable filters for use in electronic device such as battery powered communication devices.

Figure 3:
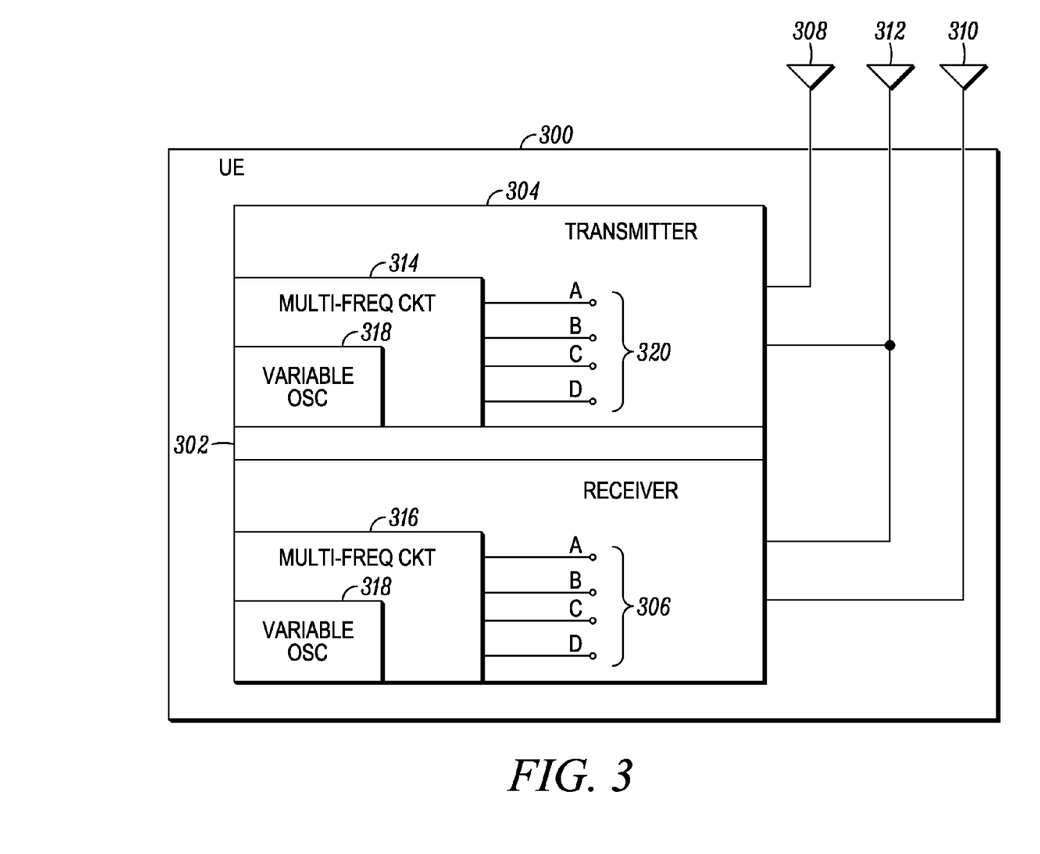
FIG. 3 is a view illustrating an exemplary UE device.

Referring to FIG. 3, a basic electrical block diagram of another embodiment of the invention is provided. Here, an exemplary UE (i.e., user equipment or mobile communication device) 300 is provided. The UE may be a mobile phone, mobile computer or other device that communicates wirelessly via RF. The UE 300 includes transceiver circuitry 302. The transceiver circuitry may include transmitter circuitry 304 and/or receiver circuitry 306. Both the transmitter circuitry 304 and the receiver circuitry 306 are designed and adapted to transmit or receive via one or more antennas 308, 310, 312. In some embodiments one or more of the antenna 312 may be shared and connected for the transmission and reception of RF signals. Additionally, in the wireless telecommunications arena, a UE 300 may utilize over 40 frequency bands to transmit and/or receive wireless communications. Multi-Frequency or multi-clock signal output circuits (multi-frequency output circuits) 314, 316, which provide a plurality of frequency signals and/or clock signals 320, are incorporated into and used in the transmit 302 and receive 304 circuitry. A variable oscillator 318, as described herein above, can be incorporated into a frequency oscillation circuit such as multi-frequency output circuit 314 or 316. Such a variable oscillator 318 can be signaled by a microprocessor (not specifically shown) within the UE to change or alter its oscillation frequency from a first frequency to a second frequency. The variable oscillator 318 will then change its oscillation frequency by temporarily exerting a mechanical or electrostatic force on the movable mass associated with the resonator portion of the oscillator so as to move the movable mass from a first position to a second position. Then, remove or discontinue exertion of the mechanical or electrostatic force from the movable mass, while the movable mass remains in the second position. The variable oscillator can now oscillate at the second frequency. As a result, the plurality of outputs 320 of the multi-frequency output circuit 114, 116 will then provide a plurality frequency or clock outputs that are different from the outputs provided when the variable oscillator was oscillating at the first frequency. Embodiments of the invention enable a UE to be manufactured with fewer oscillator devices, yet be able produce the frequencies or clock signals necessary for the transmitter 304 and receiver 306 circuits to accommodate modulation, demodulation and circuitry necessary to transmit and receive all the RF bands to be used by the UE. Additionally, the exemplary variable oscillators can be completely incorporated into the silicon circuitry of the transceiver circuitry or any part thereof while maintaining a high Q.

Figure 4:
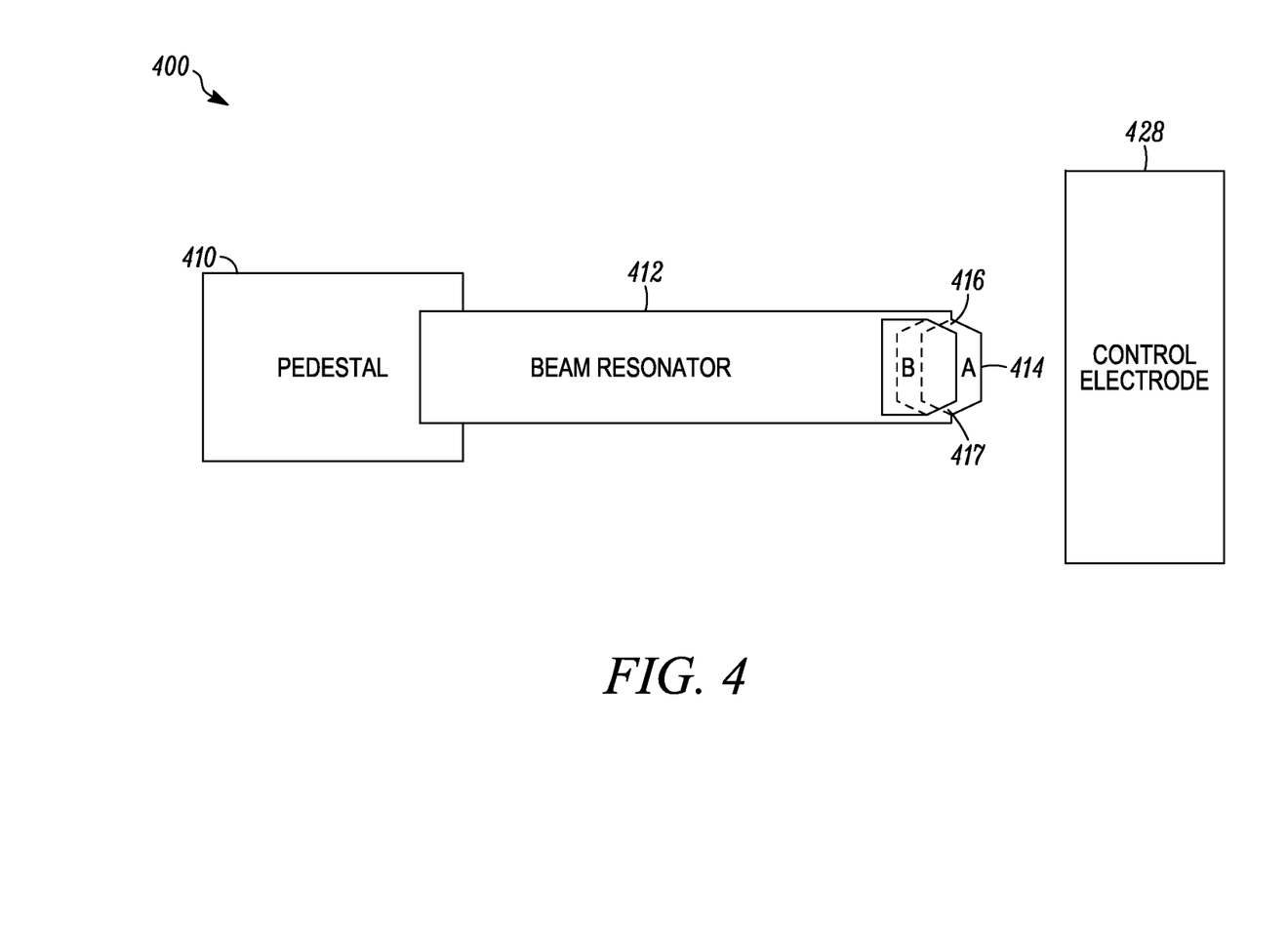
FIG. 4 is a view illustrating another tunable MEMs resonator in silicon.

In another embodiment of tunable MEMs resonator 400, a single moveable mass portion 414 may be attached to the beam resonator 412 by one or more micro-hinges 416, 417, as shown in FIG. 4. This additional exemplary embodiment provides yet another means of providing a tunable MEMs resonator or variable MEMs oscillator in accordance with the teachings of the invention. A pedestal 410 is attached to a first end of the beam resonator 412. At a second end or at a position on the beam resonator 412 distal from the pedestal, an adjustable or movable mass portion 414 is mechanically and movably attached or affixed to the beam resonator 412. The adjustable mass portion 414 is movably attached by a first micro hinge 416 and a second micro hinge 417. The micro hinges 416, 417 allow movement of the adjustable mass portion 414 to a plurality of positions. In this exemplary embodiment, there are built-in mechanical stress forces that can hold the adjustable mass portion 414 to one of two detent positions, detent position A or detent position B, in the absence of applied electromechanical force. It is understood that in other embodiments there can be more that two detent positions for the movable mass portion 414 to be positioned at.

A control electrode 428 is positioned adjacent to the adjustable mass portion 414. A voltage control input (not shown) provides, for example, a voltage differential between the control electrode 428 and the beam resonator portion 412. By applying a voltage to the control electrode an electrostatic or electromagnetic force is created that moves the movable mass 414 from detent position A to detent position B via the micro hinges 416, 417. After the moveable mass 414 is moved between position A and position B the control voltage differential between the control electrode 428 and the beam resonator 412 can be turned off and the electrostatic force removed, yet the built-in mechanical stresses of the micro-hinges 416, 417 will hold the moveable mass 414 in place. When the moveable mass 414 is moved from detent position A to detent position B the resonant frequency of the whole resonator structure is changed from a first predetermined resonant frequency in detent position A to a second predetermined resonant frequency in detent position B. Since no electrostatic or electromagnetic force is used to hold the moveable mass 414 in one detent position over another detent position, the Q of the beam resonator 412 and adjustable mass portion 414 combination is not decreased or diminished. As such, a high Q can be obtained and maintained for each state or position of the movable mass 414.

It will be appreciated by those skilled in the art having the benefit of this disclosure that this microelectronic machine based variable resonator provides a tunable high Q resonator that can be completely incorporated into an integrated circuit. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A microelectronic machine (MEM) micro-resonator comprising:
a pedestal portion;
a resonator portion attached at a first end to the pedestal portion;
a single resonation adjustment mass associated with the resonator portion, the single resonation adjustment mass being mechanically isolated from structures other than the resonator portion, the single resonation adjustment mass configured to be positionable in a plurality of settable locations in contact with the resonator portion wherein each of the settable locations results in a different resonant frequency for the MEM micro-resonator;
a control electrode mechanically isolated from the resonation adjustment mass and adapted to re-position the resonation adjustment mass from a first position to a second position of the settable locations when a predetermined charge is placed on the control electrode.

2. The micro-resonator of claim 1, wherein the resonation adjustment mass is connected to the resonator portion by a micro hinge with detents such that each detent of the micro hinge represents a different settable location.

3. The micro-resonator of claim 1, wherein the plurality of settable locations are located on a longitudinal axis of the resonator portion.

4. The micro-resonator of claim 1, wherein the settable locations are incrementally spaced from the resonator portion.

5. The micro-resonator of claim 1, wherein the resonator portion comprises a beam resonator.

6. The micro-resonator of claim 1, wherein one of the plurality of settable locations positions the resonation adjustment mass to be mechanically isolated from the resonator portion.

7. The micro-resonator of claim 1, further comprising an RF input in electrical communication with the resonator portion.

8. The micro-resonator of claim 1, further comprising a control voltage input in electrical communication with the control electrode.

9. An integrated circuit comprising:
a microelectronic machine (MEM) resonator device comprising:
a resonator structure comprising a resonator portion and a movable mass, the movable mass being mechanically isolated from structures other than the resonator portion, the movable mass configured to be positioned in one of a plurality of resonation positions in contact with the resonator portion;
a control electrode positioned substantially adjacent to but mechanically isolated from the movable mass, the control electrode configured to produce an electro-static force that moves the movable mass from one of the plurality of resonation positions to another one of the plurality of resonation positions when an electrical charge is applied to the control electrode.

10. The integrated circuit of claim 9, wherein the movable mass portion is connected to the resonator portion by a micro-hinge.

11. The integrated circuit of claim 10, wherein the micro-hinge comprises a plurality of detented positions coinciding with the plurality of resonation positions.

12. The integrated circuit of claim 9, wherein the control electrode is further configured to produce an electro-static force that moves the moveable mass to a position wherein the movable mass is mechanically isolated from the resonator portion.

13. A method of adjusting a resonance frequency of a micro-electronic machine (MEM) resonator device, wherein the MEM resonator device comprises a resonator structure comprising a resonator portion and a movable mass, the movable mass being mechanically isolated from structures other than the resonator portion, the movable mass configured to be positioned in one a plurality of resonation positions; and a control electrode positioned substantially adjacent to but mechanically isolated from the movable mass; the method comprising:
applying a charge to the control electrode to create an electrostatic force on the movable mass;
moving the movable mass from a first resonation position in contact with the resonator portion to a second resonation position in contact with the resonator portion to thereby change the overall resonation frequency of the resonator structure from a first resonation frequency to a second resonation frequency;
removing the charge from the control electrode; and
having the movable mass remain in the second resonation position.

14. The method of claim 13, further comprising holding the movable mass in the second resonation position by a detent.

15. A wireless communication device comprising:
a receiver circuit, the receiver circuit comprising a microelectronic machine (MEM) micro-resonator comprising:
a pedestal portion;
a resonator portion attached at a first end to the pedestal portion;
a resonation adjustment mass associated with the resonator portion, the resonation adjustment mass being mechanically isolated from structures other than the resonator portion, the resonation adjustment mass configured to be positionable in a plurality of settable locations wherein each of the settable locations results in a different resonant frequency for the MEM micro-resonator;
a control electrode mechanically isolated from the resonation adjustment mass and adapted to re-position the resonation adjustment mass from a first position in contact with the resonator portion to a second position in contact with the resonator portion when a predetermined charge is placed on the control electrode.

* * * * *